(12) United States Patent
Yang et al.

(10) Patent No.: US 11,818,961 B2
(45) Date of Patent: *Nov. 14, 2023

(54) SELF-ALIGNED ENCAPSULATION HARD MASK TO SEPARATE PHYSICALLY UNDER-ETCHED MTJ CELLS TO REDUCE CONDUCTIVE RE-DEPOSITION

(71) Applicant: Taiwan Semiconductor Manufacturing Company, Ltd., Hsinchu (TW)

(72) Inventors: Yi Yang, Fremont, CA (US); Dongna Shen, San Jose, CA (US); Vignesh Sundar, Fremont, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/816,035

(22) Filed: Jul. 29, 2022

(65) Prior Publication Data

US 2022/0367793 A1 Nov. 17, 2022

Related U.S. Application Data

(63) Continuation of application No. 17/121,457, filed on Dec. 14, 2020, which is a continuation of application
(Continued)

(51) Int. Cl.
*H01L 43/12* (2006.01)
*H01L 43/02* (2006.01)
(Continued)

(52) U.S. Cl.
CPC ......... *H10N 50/01* (2023.02); *H01F 10/3254* (2013.01); *H01F 41/34* (2013.01);
(Continued)

(58) Field of Classification Search
CPC ............. H01L 21/28141; H01L 27/222; H01L 29/0653; H01L 29/6653; H01L 29/66553;
(Continued)

(56) References Cited

U.S. PATENT DOCUMENTS 9,705,071 B2 * 7/2017 Annunziata ............ H10N 50/80
11,444,241 B2 * 9/2022 Yang ....................... H10N 50/10
(Continued)

*Primary Examiner* — David C Spalla
(74) *Attorney, Agent, or Firm* — HAYNES AND BOONE, LLP

(57) ABSTRACT

A method for etching a magnetic tunneling junction (MTJ) structure is described. A MTJ stack is deposited on a bottom electrode wherein the MTJ stack comprises at least a pinned layer, a barrier layer on the pinned layer, and a free layer on the barrier layer, A top electrode layer is deposited on the MTJ stack. A hard mask is deposited on the top electrode layer. The top electrode layer and hard mask are etched. Thereafter, the MTJ stack not covered by the hard mask is etched, stopping at or within the pinned layer. Thereafter, an encapsulation layer is deposited over the partially etched MTJ stack and etched away on horizontal surfaces leaving a self-aligned hard mask on sidewalls of the partially etched MTJ stack. Finally, the remaining MTJ stack not covered by hard mask and self-aligned hard mask is etched to complete the MTJ structure.

20 Claims, 2 Drawing Sheets

Related U.S. Application Data

No. 16/113,079, filed on Aug. 27, 2018, now Pat. No. 10,868,237.

(51) Int. Cl.
*H01F 41/34* (2006.01)
*H01F 10/32* (2006.01)
*H10N 50/01* (2023.01)
*H10N 50/80* (2023.01)
*G11C 11/16* (2006.01)
*H10B 61/00* (2023.01)

(52) U.S. Cl.
CPC ............ *H10N 50/80* (2023.02); *G11C 11/161* (2013.01); *H10B 61/00* (2023.02)

(58) Field of Classification Search
CPC ..... H01L 29/6656; H01L 43/02; H01L 43/08; H01L 43/10; H01L 43/12; G11C 11/161; H01F 10/3254; H01F 41/32; H01F 41/34; H10N 50/01; H10N 50/80; H10B 61/00
See application file for complete search history.

(56) References Cited

U.S. PATENT DOCUMENTS

| 2006/0261425 A1* | 11/2006 | Suemitsu | H10N 50/01 257/E27.005 |
| 2015/0061052 A1* | 3/2015 | Huang | H10N 50/01 257/421 |
| 2019/0214554 A1* | 7/2019 | Li | G11C 11/1673 |

* cited by examiner

SELF-ALIGNED ENCAPSULATION HARD MASK TO SEPARATE PHYSICALLY UNDER-ETCHED MTJ CELLS TO REDUCE CONDUCTIVE RE-DEPOSITION

PRIORITY DATA

The present application is a continuation application of U.S. application Ser. No. 17/121,457, filed Dec. 14, 2020, which is a continuation application of U.S. application Ser. No. 16/113,079, filed Aug. 27, 2018, each of which is herein incorporated by reference in its entirety.

TECHNICAL FIELD

This application relates to the general field of magnetic tunneling junctions (MTJ) and, more particularly, to etching methods for forming MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE) or their combination are usually involved. During RIE, high energy ions remove materials vertically in those areas not masked by photoresist, separating one MTJ cell from another.

However, the high energy ions can also react with the non-removed materials, oxygen, moisture and other chemicals laterally, causing sidewall damage and lowering device performance. To solve this issue, pure physical etching techniques such as Ar RIE or ion beam etching (IBE) have been applied to etch the MTJ stack. However, due to the non-volatile nature, physically etched conductive materials in the MTJ and bottom electrode can form a continuous path across the tunnel barrier, resulting in shorted devices. A new approach to overcome this dilemma is thus needed if one wants to unleash the full potential of this physical etch to pattern the future sub 60 nm MRAM products.

Several references teach multi-step etching methods to form MTJ's, including U.S. Pat. No. 9,793,126 (Dhindsa et al), U.S. Pat. No. 9,722,174 (Nagel et al), and U.S. Pat. No. 8,883,520 (Satoh et al). All of these references are different from the present disclosure.

SUMMARY

It is an object of the present disclosure to provide an improved method of forming MTJ structures.

Yet another object of the present disclosure is to provide a method of forming MTJ devices using a physical under-etch to avoid both chemical damage and physical shorts.

A further object of the present disclosure is to provide a method of forming MTJ devices using a physical underetch to avoid both chemical damage and physical shorts where separate and non-interacting MTJ cells are made using encapsulation material as a self-aligned process.

In accordance with the objectives of the present disclosure, a method for etching a magnetic tunneling junction (MTJ) structure is achieved. A MTJ stack is deposited on a bottom electrode wherein the MTJ stack comprises at least a pinned layer, a barrier layer on the pinned layer, and a free layer on the barrier layer. A top electrode layer is deposited on the MTJ stack. A hard mask is deposited on the top electrode layer. The top electrode layer and hard mask are etched. Thereafter, the MTJ stack not covered by the hard mask is etched, stopping at or within the pinned or the seed layer. Thereafter, an encapsulation layer is deposited over the partially etched MTJ stack and etched away on horizontal surfaces leaving a self-aligned hard mask on sidewalls of the partially etched MTJ stack. Finally, the remaining MTJ stack not covered by hard mask and self-aligned hard mask is etched to complete the MTJ structure.

BRIEF DESCRIPTION OF THE DRAWINGS

In the accompanying drawings forming a material part of this description, there is shown.

DETAILED DESCRIPTION

In a typical process, the whole MTJ stack is patterned by a single step of etch, either by chemical RIE or physical Ar RIE or IBE. It therefore creates either chemical damage or physical shorts on the MTJ sidewall. In the process of the present disclosure, we first partially etch the MTJ stack to minimize the physical re-deposition. Then, using encapsulation material as a self-aligned hard mask, the remaining MTJ is etched. This new process avoids chemical damage and physical shorts simultaneously. Moreover, the second step of etch is a self-aligned process, meaning it does not require a complicated photolithography step, where the overlay is hard to control, especially for sub 60 nm MRAM devices.

In the process of the present disclosure, the MTJ stack is first partially etched by a physical etch such as RIE or IBE using different gas plasma such as Ar and Xe, so that there is no chemical damage but only conductive re-deposition on the sidewall. The amount of re-deposition is dependent on the etch amount. By intentionally under etching, e.g., only etching away the free layer, tunnel barrier and/or part of the pinned or the seed layer, the re-deposition on the tunnel barrier sidewall can be significantly reduced or totally removed. An encapsulation material is deposited to protect the earlier etched MTJ. A RIE or IBE etch partially clears out the portion of encapsulation material that is on top and bottom of the MTJ patterns. Next, using the encapsulation material left on the MTJ sidewalls as a self-aligned hard mask, the remaining MTJ is etched, creating separate and non-interacting MTJ cells. Regardless of what type of etch is used, the free layer and tunnel barrier layer would not be affected by this step due to the encapsulation material's protection, thus preserving high device performance.

Figure 1:
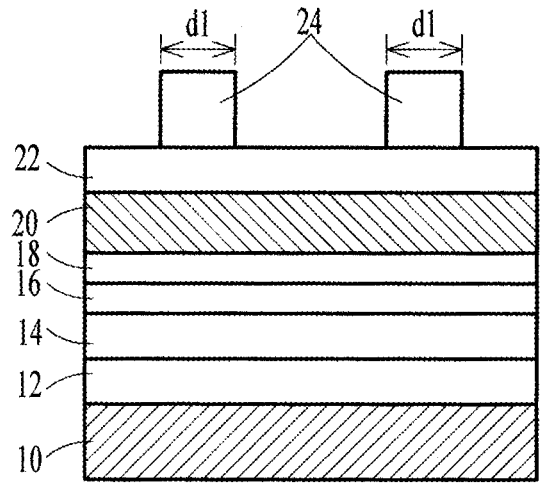
FIGS. 1 through 6 illustrate in cross-sectional representation steps in a preferred embodiment of the present disclosure.

Referring now to FIGS. 1 through 6, the novel method of the present disclosure will be described in detail. Referring now more particularly to FIG. 1, there is shown a bottom electrode 10 formed on a substrate, not shown. Now, layers are deposited on the bottom electrode to form a magnetic tunnel junction. For example, seed layer 12, pinned layer 14, tunnel barrier layer 16, and free layer 18 are deposited.

There may be one or more pinned, barrier, and/or free layers. A metal hard mask 20, such as Ta, TaN, Ti, TiN, W, Cu, Mg, Ru, Cr, Co, Fe, Ni or their alloys, is deposited to a thickness of 10-100 nm, and preferably ≥50 nm, on top of the MTJ stack. This hard mask will be used as a top electrode. Finally, a dielectric hard mask material 22, such as $SiO_2$, SiN, SiON, SiC or SiCN, is deposited to a thickness of 20 nm onto the top electrode 20. Photoresist is patterned by 248 nm photolithography, for example, to form photoresist pillar patterns 24 with size d1 of ~70-80 nm and height 200 nm.

Figure 2:
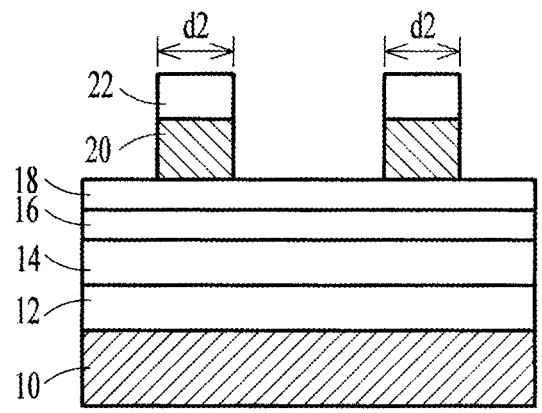

Now, as illustrated in FIG. 2, the dielectric and metal hard masks 22 and 20 are etched by a fluorine carbon based plasma such as $CF_4$ or $CHF_3$ alone, or mixed with Ar and $N_2$. $O_2$ can be added to reduce the pillar size d2 from 50-60 nm to 30-40 nm. They can also be etched by physical RIE or IBE (pure Ar), followed by large angle (70-90° with respect to the pillar's normal line) IBE trimming, forming pillar size d2 of 30-40 nm.

Figure 3:
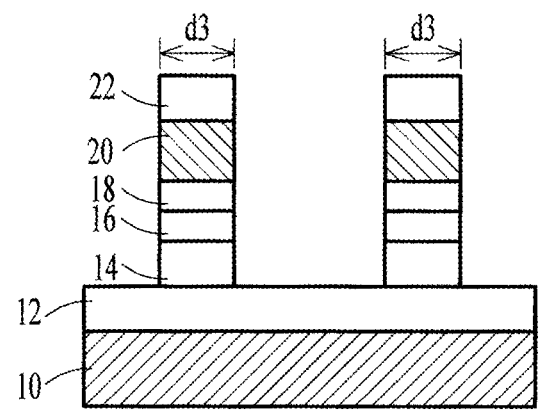

Referring now to FIG. 3, the MTJ stack is partially etched using physical RIE (pure Ar or Xe) or IBE stopping either on the pinned layer or the seed layer with similar pattern size, to minimize the metal re-deposition on the tunnel barrier. Because of the nature of a physical etch, there is no chemical damage. The height h of the partially etched MTJ stack is between about 5 and 30 nm.

Figure 4:
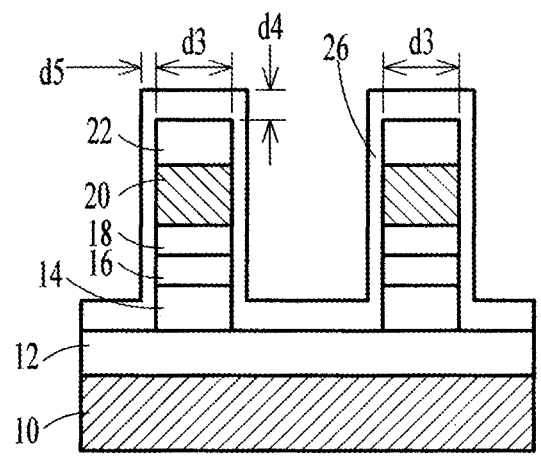
Figure 5:
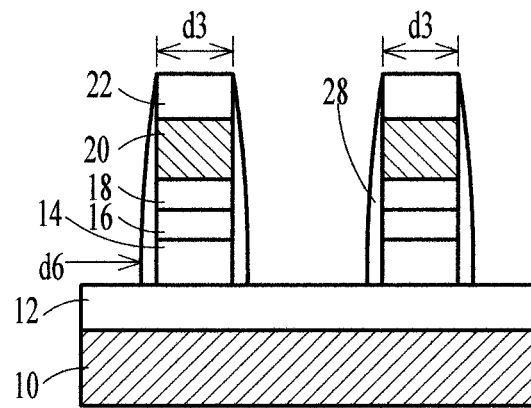

Now, as illustrated in FIG. 4, an encapsulation material 26 made of dielectric materials such as SiN, SiC, SiCN, carbon, or TaC or metal oxides such as $Al_2O_3$ or MgO with thickness d4 of 5-30 nm, is either in-situ or ex-situ deposited by CVD, PVD or ALD onto the partially etched MTJ patterns. The portion of the encapsulation material on top and bottom of the patterns is etched away by RIE or IBE, leaving encapsulation spacers 28 on the sidewalls, as shown in FIG. 5, having a thickness d6 of 10-30 nm. Depending on the material used for the spacer, different plasma can be used for this etching step. For example, a fluorine carbon based plasma such as $CF_4$ or $CHF_3$ can be used for SiN, SiC, and SiCN, $O_2$ can be applied for carbon, a fluorine carbon such as $CF_4$ or $CHF_3$ or a halogen such as $Cl_2$, or their combination, can be used for TaC, and a halogen such as $Cl_2$ alone or mixed with Ar can be used for $Al_2O_3$ and MgO.

Figure 6:
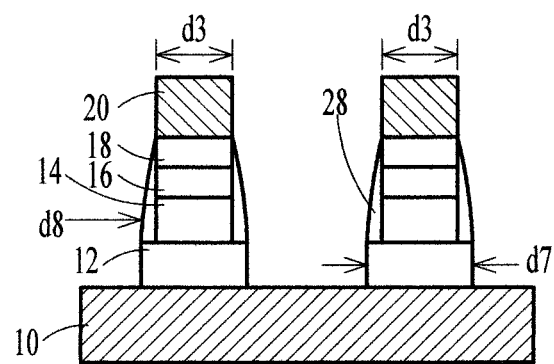

Finally using the encapsulation 28 left on the sidewalls of the MTJ patterns as a self-aligned hard mask, as shown in FIG. 6, the remaining MTJ stack such as the pinned layer 14 and/or seed layer 12 can be etched by RIE or IBE. When a RIE etch is used, since the pinned layer and seed layer fabricated by this method are larger than the free layer, the chemical damage on the pinned layer and seed layer would not affect its central portion which is aligned with the free layer. When physical RIE or IBE is used, the metal re-deposition from the pinned and seed layers would not be in contact with the tunnel barrier due to the encapsulation's protection. Note that this pinned and seed layer etch is a self-aligned step, meaning it has no overlay control issue, which is usually associated with sub 60 nm MRAM device fabrication.

More importantly, the pinned and seed layers' sizes are greatly dependent on the thickness of the encapsulation sidewall serving as the hard mask, which is determined by its initial deposition thickness and later etch conditions. By tuning these parameters, one can precisely control the pinned and seed layers' sizes according to the device design. For instance, one can create a thick spacer having a thickness d8 of 10-20 nm on the free layer's sidewall so that the later defined tunnel barrier and pinned layers are of the size d7 of 50-60 nm, larger than the free layer d3 of 40-50 nm. This is particularly critical for small cell size devices since it allows for strong pinning strength, increasing the energy barrier and reducing the switching current.

In summary, the process of the present disclosure uses a physical under etch to avoid both chemical damage and physical shorts. Moreover, separate and non-interacting MTJ cells are made using encapsulation material as a self-aligned process, meaning it has no overlay control issue, which is usually associated with sub 60 nm MRAM device fabrication. It is thus possible to replace the widely used chemical RIE etch, which inevitably brings chemical damage on the MTJ sidewall. This process will be used for MRAM chips of the size smaller than 60 nm as problems associated with chemically damaged sidewalls and re-deposition from the MTJ stack and bottom electrode become very severe for the smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method comprising:
   forming a stack of magnetic tunneling junction (MTJ) layers over a first electrode;
   forming a second electrode on the stack of MTJ layers;
   removing a first portion of the stack of MTJ layers to form a patterned first portion while using the first electrode as a mask, wherein a second portion of the stack of MTJ layers covers a top surface of the first electrode after the removing of the first portion of the stack of MTJ layers;
   forming a spacer on a sidewall of the patterned first portion of the stack of MTJ layers; and
   removing a first portion of the spacer to expose a sidewall surface of the second electrode.

2. The method of claim 1, wherein the removing of the first portion of the spacer includes removing the second portion of the stack of MTJ layers.

3. The method of claim 1, wherein the removing of the first portion of the stack of MTJ layers includes performing a first reactive ion etching process, and
   wherein the removing a first portion of the spacer to expose a sidewall surface of the second electrode layer includes performing a second reactive ion etching process.

4. The method of claim 1, wherein the removing of the first portion of the stack of MTJ layers includes performing a first ion beam etching process, and
   wherein the removing a first portion of the spacer to expose a sidewall surface of the second electrode layer includes performing a second ion beam etching process.

5. The method of claim 1, further comprising forming a hard mask on the second electrode, and
   wherein the hard mask is part of the mask used in removing the first portion of the stack of MTJ layers to form the patterned first portion.

6. The method of claim 1, wherein the hard mask includes a material selected from the group consisting of SiO2, SiN, SiON, SiC and SiCN.

7. The method of claim 1, wherein the patterned first portion of the stack of MTJ layers includes a tunnel barrier layer and a free layer, and
   wherein the second portion of the stack of MTJ layers includes a seed layer.

8. A method comprising:
   providing a stack of magnetic tunneling junction (MTJ) layers having an electrode layer disposed over the stack of MTJ layers;
   forming an encapsulation layer on the electrode layer and the stack of MTJ layers;

removing portions of the encapsulation layer to form a spacer along a sidewall of the electrode layer and a sidewall of the stack of MTJ layers; and removing a first portion of the spacer to expose the sidewall of the electrode layer.

9. The method of claim 8, wherein a second portion of the spacer covers the sidewall of the stack of MTJ layers after the removing of the first portion of the spacer.

10. The method of claim 9, wherein the sidewall of the stack of MTJ layers is defined by a free layer and a tunnel barrier layer, and wherein the second portion of the spacer covers the sidewall of the stack of MTJ layers defined by the free layer and the tunnel barrier layer.

11. The method of claim 8, patterning the stack of MTJ layers while using the spacer as a mask.

12. The method of claim 8, wherein the encapsulation layer includes carbon.

13. The method of claim 8, wherein the encapsulation layer includes silicon and nitrogen.

14. The method of claim 8, wherein the encapsulation layer includes a metal oxide material.

15. The method of claim 8, wherein the providing of the stack of MTJ layers having the electrode layer disposed over the stack of MTJ layers includes providing a stack of MTJ layer having a first portion with a first width and a second portion with a second width, the second width being different than the first width, and wherein the first portion includes a free layer and a tunnel barrier layer and the second portion includes a seed layer.

16. A magnetic tunneling junction (MTJ) device comprising:

a stack of MTJ layers disposed on a first electrode, the stack of MTJ layers including a seed layer, a pinned layer, a barrier layer and a free layer;

a dielectric spacer disposed along and physically contacting a sidewall of at least one of the pinned layer, the barrier layer and the free layer; and a second electrode disposed over and having a bottom surface facing the free layer, the bottom surface of the second electrode extending between opposing sidewalls of the second electrode and at least a portion of the opposing sidewalls of the second electrode being free of the dielectric spacer.

17. The MTJ device of claim 16, wherein the dielectric spacer physically contacts sidewalls of the pinned layer, the barrier layer and the free layer.

18. The MTJ device of claim 16, wherein the seed layer is wider than each of the pinned layer, the barrier layer and the free layer.

19. The MTJ device of claim 16, wherein the seed layer has a bottom surface facing the first electrode, the bottom surface of the seed layer extending between opposing sidewalls of the seed layer, and wherein at least a portion of the opposing sidewalls of the seed layer are free of the dielectric spacer.

20. The MTJ device of claim 16, wherein the dielectric spacer does not extend to the first electrode.

\* \* \* \* \*